(12) United States Patent
Yeh et al.

(10) Patent No.: US 12,419,071 B2
(45) Date of Patent: Sep. 16, 2025

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Chih-Tung Yeh, Taoyuan (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 517 days.

(21) Appl. No.: 17/896,106

(22) Filed: Aug. 26, 2022

(65) Prior Publication Data
US 2024/0038871 A1 Feb. 1, 2024

(30) Foreign Application Priority Data

Jul. 27, 2022 (TW) .................................. 111128124

(51) Int. Cl.
| | |
|---|---|
| *H10D 30/01* | (2025.01) |
| *H01L 21/02* | (2006.01) |
| *H01L 21/225* | (2006.01) |
| *H10D 30/47* | (2025.01) |
| *H10D 62/85* | (2025.01) |

(52) U.S. Cl.
CPC ..... *H10D 30/015* (2025.01); *H01L 21/02458* (2013.01); *H01L 21/0254* (2013.01); *H01L 21/2257* (2013.01); *H10D 30/475* (2025.01); *H10D 62/8503* (2025.01)

(58) Field of Classification Search
CPC ...... H01L 21/182; H01L 21/225–2258; H10D 30/015; H10D 30/471; H10D 30/475; H10D 30/4755
See application file for complete search history.

(56) References Cited

U.S. PATENT DOCUMENTS

| | | | |
|---|---|---|---|
| 9,412,856 B2 | 8/2016 | Fujimoto | |
| 2011/0092057 A1* | 4/2011 | Suvorov | .............. H10D 62/149 257/E21.333 |
| 2013/0285021 A1 | 10/2013 | Jenekhe | |
| 2014/0252368 A1* | 9/2014 | Lee | .................... H10D 30/4755 257/194 |
| 2017/0077255 A1 | 3/2017 | Yao et al. | |

FOREIGN PATENT DOCUMENTS

| | | |
|---|---|---|
| TW | 202115909 A | 4/2021 |
| TW | 202205668 A | 2/2022 |

* cited by examiner

*Primary Examiner* — Tucker J Wright
(74) *Attorney, Agent, or Firm* — Winston Hsu

(57) ABSTRACT

A method for fabricating a high electron mobility transistor (HEMT) includes the steps of forming a buffer layer on a substrate, forming a barrier layer on the buffer layer, forming a p-type semiconductor layer on the barrier layer, forming a hole injection buffer layer (HIBL) on the p-type semiconductor layer, and forming a gate electrode on the HIBL.

8 Claims, 2 Drawing Sheets

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and fabrication method thereof.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of forming a buffer layer on a substrate, forming a barrier layer on the buffer layer, forming a p-type semiconductor layer on the barrier layer, forming a hole injection buffer layer (HIBL) on the p-type semiconductor layer, and forming a gate electrode on the HIBL.

According to another aspect of the present invention, a high electron mobility transistor (HEMT) includes a buffer layer on a substrate, a barrier layer on the buffer layer, a p-type semiconductor layer on the barrier layer, a hole injection buffer layer (HIBL) on the p-type semiconductor layer, and a gate electrode on the HIBL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
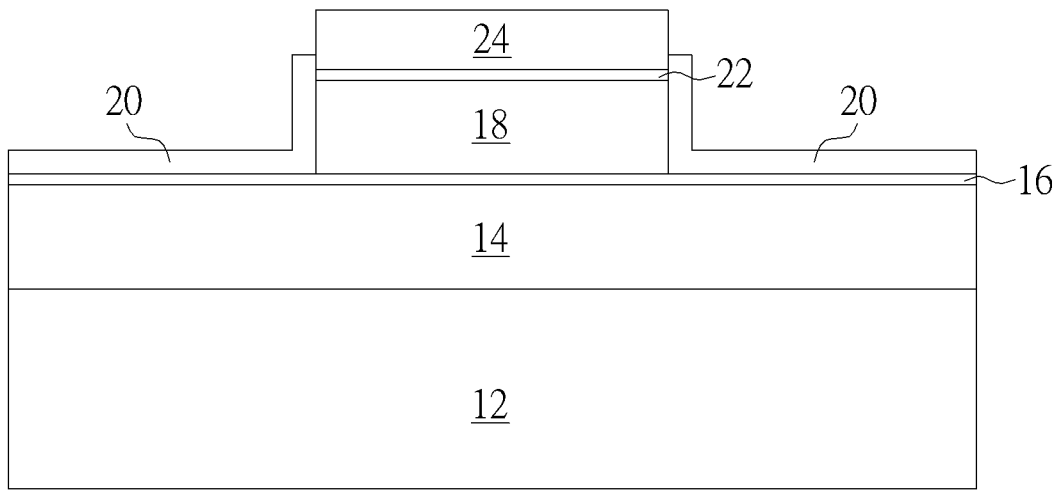
FIGS. 1-3 illustrate a method for fabricating a HEMT according to an embodiment of the present invention.
Figure 2:
Figure 2:
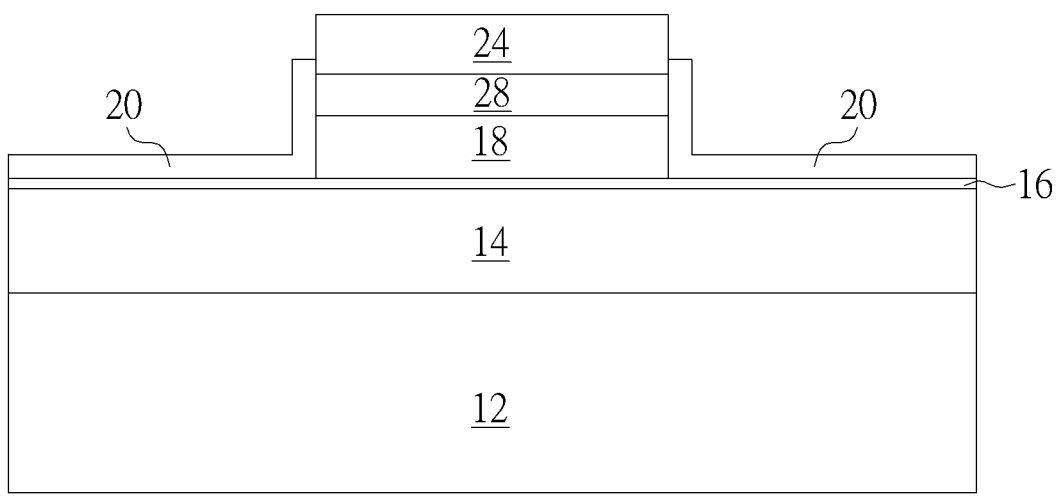
Figure 3:
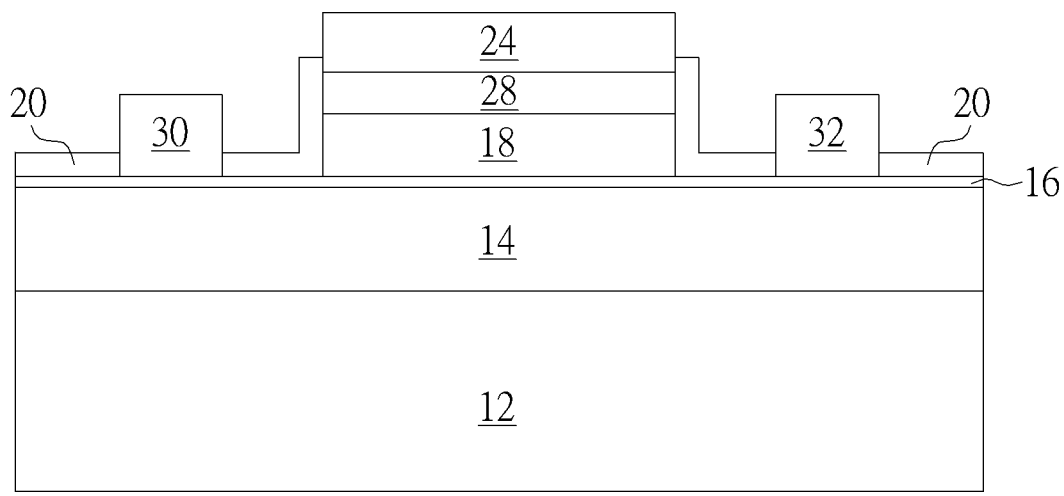

Referring to FIGS. 1-3, FIGS. 1-3 illustrate a method for fabricating a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown) and a buffer layer 14 are formed on the substrate 12. According to an embodiment of the present invention, the nucleation layer preferably includes aluminum nitride (AlN) and the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a selective unintentionally doped (UID) buffer layer (not shown) could be formed on the surface of the buffer layer 14. In this embodiment, the UID buffer layer is preferably made of III-V semiconductors such as gallium nitride (GaN) or more specifically unintentionally doped GaN. According to an embodiment of the present invention, the formation of the UID buffer layer on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14 or UID buffer layer. In this embodiment, the barrier layer 16 is preferably made of III-V semiconductor such as n-type or n-graded aluminum gallium nitride ($Al_xGa_{1-x}N$), in which $0<x<1$, the barrier layer 20 preferably includes an epitaxial layer formed through epitaxial growth process, and the barrier layer 16 could include dopants such as silicon or germanium. Similar to the buffer layer 14, the formation of the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 18 is formed on the barrier layer 16, a photo-etching process is conducted to pattern or remove part of the p-type semiconductor layer 18, a passivation layer 20 is formed on the p-type semiconductor layer 18, another photo-etching process is conducted to pattern or remove part of the passivation layer 20 for exposing the p-type semiconductor layer 18 surface, a silicon layer or more specifically an amorphous silicon layer 22 is formed on the surface of the p-type semiconductor layer 18, and a gate electrode 24 is formed on the amorphous silicon layer 22. Preferably, the formation of the amorphous silicon layer 22 and gate electrode 24 could be accomplished by sequentially forming an amorphous silicon layer 22 and a gate electrode 24 on the passivation layer 20 and the exposed p-type semiconductor layer 18 entirely, and then using a photo-etching process to remove part of the gate electrode 24 and part of the amorphous silicon layer 22 for forming a patterned amorphous silicon layer 22 and a patterned gate electrode 24, in which the sidewalls of the patterned amorphous silicon layer 22 and gate electrode 24 are aligned with the sidewall of the p-type semiconductor layer 18 underneath.

In this embodiment, the p-type semiconductor layer 18 is a III-V compound semiconductor layer preferably including p-type GaN (pGaN) and the formation of the p-type semiconductor layer 18 on the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Even though the passivation layer 20 in this embodiment pertains to be a single-layered structure, according to other embodiment of the present invention, it would also be desirable to form a passivation layer 20 made from a dual layer or tri-layer structure, in which the passivation layer 20 could include dielectric material including but not limited to for example silicon oxide, silicon nitride, or aluminum oxide. Moreover, the thickness of the amorphous silicon layer 22 is between ⅙ to ⅒ of the entire thickness of the p-type semiconductor layer 18. For instance, the thickness of the amorphous silicon layer 22 at this stage is preferably between 2-10 nm or most preferably 5 nm while the thickness of the p-type semiconductor layer 18 is preferably between 60-100 nm.

Next, as shown in FIG. 2, an anneal process 26 is conducted to drive silicon atoms from the amorphous silicon layer 22 downward into the p-type semiconductor layer 18 for forming a hole injection buffer layer (HIBL) 28 made of silicon, in which the silicon atoms within the HIBL 28 could include a gradient concentration. For instance, the silicon concentration closer to the bottom surface of the HIBL 28 is slightly less than the silicon concentration closer to the bottom surface of the HIBL 28. In this embodiment, the anneal process 26 could include a rapid thermal anneal (RTP) process or a furnace anneal process, in which the temperature of the RTP process is between 500-600° C. and the temperature of the furnace anneal process is between 200-600° C.

Preferably, the thickness of the HIBL 28 after being treated with anneal process 26 is slightly greater than the thickness of the amorphous silicon layer 22 formed previously. For instance, the overall thickness of the HIBL 28 is about ⅓ or most preferably between ½ to ⅓ of the thickness of the p-type semiconductor layer 18. It should be noted that if the amorphous silicon layer 22 were directly treated with the anneal process 26 without any covering or any layer on top, the silicon nature of layer 22 would be easily oxidized into silicon oxide. To prevent this, the present invention first forms the amorphous silicon layer 22 and the gate electrode 24 on the surface of the p-type semiconductor layer 18 and then conducts an anneal process 26 to transform the amorphous silicon layer 22 into the HIBL 28.

Next, as shown in FIG. 3, a photo-etching process is conducted to remove part of the passivation layer 20 adjacent to two sides of the gate electrode 24 for forming two openings (not shown), and then form conductive materials into the openings along with additional photo-etching process for forming a source electrode 30 and a drain electrode 32 adjacent to two sides of the gate electrode 24. In this embodiment, the gate electrode 24, the source electrode 30, and the drain electrode 32 are preferably made of metal, in which the gate electrode 24 is preferably made of Schottky metal while the source electrode 30 and the drain electrode 32 are preferably made of ohmic contact metals. According to an embodiment of the present invention, each of the gate electrode 24, source electrode 30, and drain electrode 32 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned openings, and then pattern the electrode materials through one or more etching processes to form the gate electrode 24, source electrode 30, and the drain electrode 32. This completes the fabrication of a HEMT according to an embodiment of the present invention.

Overall, the present invention first forms an amorphous silicon layer on the surface of a patterned p-type semiconductor layer, forms a gate electrode on the amorphous silicon layer, and then conducts an anneal process to drive silicon atoms from the amorphous silicon layer into the p-type semiconductor layer underneath for forming a HIBL. According to a preferred embodiment of the present invention, the silicon atoms within the HIBL could be used as donors to neutralize acceptors such as magnesium (Mg) on surface of the p-type semiconductor layer so that it would more difficult for holes to enter the p-type semiconductor layer and the barrier layer thereby reducing gate leakage. Moreover, HIBL could also be used to improve reliability test for high temperature gate bias (HTGB) of the HEMT device and increase Vg operating range so that more flexibility could be provided to the designers on circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:
    forming a buffer layer on a substrate;
    forming a barrier layer on the buffer layer;
    forming a p-type semiconductor layer on the barrier layer;
    patterning the p-type semiconductor layer;
    forming a passivation layer on the p-type semiconductor layer;
    patterning the passivation layer to expose the p-type semiconductor layer;
    forming a silicon layer on the p-type semiconductor layer;
    forming a gate electrode on the silicon layer;
    performing an anneal process to transform the silicon layer into a hole injection buffer layer (HIBL); and
    forming a source electrode and a drain electrode adjacent to two sides of the gate electrode.

2. The method of claim 1, wherein the silicon layer comprises an amorphous silicon layer.

3. The method of claim 1, wherein the anneal process comprises a rapid thermal anneal process.

4. The method of claim 1, wherein a thickness of the silicon layer is less than a thickness of the HIBL.

5. The method of claim 1, wherein the buffer layer comprises gallium nitride (GaN).

6. The method of claim 1, wherein the barrier layer comprise $Al_xGa_{1-x}N$.

7. The method of claim 1, wherein the p-type semiconductor layer comprises p-type gallium nitride (pGaN).

8. The method of claim 1, wherein the HIBL comprises a gradient concentration of silicon.

* * * * *